United States Patent
Namba et al.

(10) Patent No.: US 6,762,007 B2
(45) Date of Patent: Jul. 13, 2004

(54) CHEMICAL AMPLIFICATION TYPE POSITIVE RESIST COMPOSITION

(75) Inventors: Katsuhiko Namba, Toyonaka (JP); Masumi Suetsugu, Toyonaka (JP); Koshiro Ochiai, Toyonaka (JP)

(73) Assignee: Sumitomo Chemical Company, Limited, Osaka (JP)

(*) Notice: Subject to any disclaimer, the term of this patent is extended or adjusted under 35 U.S.C. 154(b) by 0 days.

(21) Appl. No.: 10/390,924

(22) Filed: Mar. 19, 2003

(65) Prior Publication Data

US 2003/0180663 A1 Sep. 25, 2003

(30) Foreign Application Priority Data

Mar. 20, 2002 (JP) .................................... 2002-078355

(51) Int. Cl.$^7$ ............................ G03C 1/73; G03F 7/039
(52) U.S. Cl. ................... 430/270.1; 430/326; 430/905; 430/909; 430/914
(58) Field of Search .................. 430/270.1, 326, 430/905, 909, 914

(56) References Cited

U.S. PATENT DOCUMENTS

| | | | | |
|---|---|---|---|---|
| 5,204,218 A | * | 4/1993 | Kumada et al. | ......... 430/270.1 |
| 5,976,759 A | | 11/1999 | Urano et al. | ............. 430/270.1 |
| 6,153,349 A | * | 11/2000 | Ichikawa et al. | ........... 430/170 |

FOREIGN PATENT DOCUMENTS

EP    1 024 406 A1 *  8/2000

* cited by examiner

Primary Examiner—Mark F. Huff
Assistant Examiner—Sin J. Lee
(74) Attorney, Agent, or Firm—Birch, Stewart, Kolasch & Birch, LLP

(57) ABSTRACT

The present invention provides a chemical amplification type positive resist composition comprising (A) resin having a phenol skeleton wherein the phenol skeleton has protective group which can be dissociated by the action of an acid, the phenol skeleton itself is insoluble or poorly soluble in an alkali aqueous solution and the phenol skeleton becomes soluble in an alkali aqueous solution after dissociation of the protective group,
(B) resin obtained by protecting a part of hydroxyl group in poly(p-hydroxystyrene) with pivaloyl group and
(C) an acid generator.

8 Claims, No Drawings

CHEMICAL AMPLIFICATION TYPE POSITIVE RESIST COMPOSITION

BACKGROUND OF THE INVENTION

1. Field of the Invention

The present invention relates to a resist composition suitable for lithography and the like acting by high-energy radiation such as far ultraviolet ray (including excimer laser and the like), electron beam, X ray or radiation light.

2. Prior Art

Recently, formation of sub-micron patterns is required because of enhanced integration of integrated circuits. Particularly, lithography using excimer laser from krypton fluoride (KrF) or argon fluoride (ArF) is drawing attention since it enables production of 64 M to 1 G DRAM. As the resist suitable for such excimer laser lithography process, so-called chemical amplification type resist utilizing chemical amplification effect is being adopted. With the chemical amplification type resist, acids generated from an acid generator in parts irradiated with radioactive ray are diffused by the post exposure bake (hereinafter, sometimes abbreviated as PEB), and the solubility of the irradiated parts in an alkali developer is changed by a reaction using the acid as a catalyst, and thereby positive or negative patterns are obtained.

The chemical amplification type positive resist comprises resin which itself is insoluble or poorly soluble in an alkali aqueous solution but becomes soluble in an alkali aqueous solution by the action of an acid, and an acid generator. In general, as the resin which itself is insoluble or poorly soluble in an alkali aqueous solution but becomes soluble in an alkali aqueous solution by the action of an acid, poly(p-hydroxystyrene) protected with acetal group is used. However, when the ratio of the acetal protective group to the resin is increased for enhancing the resolution of the resist, the resolution of dense patterns (dense resolution) increases, while the resolution of isolated patterns (isolated resolution) deteriorates, and when the ratio of the acetal protective group to the resin is decreased for enhancing the isolated resolution, the dense resolution deteriorates, and solubility in an alkali developer increases and membrane remaining ratio decreases, and the like. Therefore, it has been industrially extremely difficult to increase basic abilities such as resolution, particularly isolated resolution and the like by controlling the ratio of the above-mentioned acetal protective group, without lowering membrane remaining ratio.

SUMMARY OF THE INVENTION

An object of the present invention is to provide a chemical amplification type positive resist composition which can enhance basic abilities such as sensitivity, resolution, particularly isolated resolution and the like, without lowering membrane remaining ratio.
(0005)

The present inventors have found that the object of the present invention is accomplished by using specific resins in combination as the resin components of a chemical amplification type positive resist composition.
(0006)

Namely, the present invention relates to the followings.

<1> A chemical amplification type positive resist composition comprising (A) resin having a phenol skeleton wherein the phenol skeleton has protective group which can be dissociated by the action of an acid, the phenol skeleton itself is insoluble or poorly soluble in an alkali aqueous solution and the phenol skeleton becomes soluble in an alkali aqueous solution after dissociation of the protective group (hereinafter referred to "Component (A)"), (B) resin obtained by protecting a part of hydroxyl group in poly(p-hydroxystyrene) with pivaloyl group (hereinafter referred to "Component (B)") and (C) an acid generator (hereinafter referred to "Component (C)").

<2> The chemical amplification type positive resist composition according to <1>, wherein the content of Component (A), Component (B) and Component (C) is 50 to 89.9%, 10 to 50% and 0.1 to 20% by weight respectively, based on the total solid content in the resist composition.

<3> The chemical amplification type positive resist composition according to <1> or <2>, wherein the protective group in Component (A) is acetal group.

<4> The chemical amplification type positive resist composition according to <1> or <2>, wherein the protective group in Component (A) is 1-ethoxyethyl group.

<5> The chemical amplification type positive resist composition according to any one of <1> to <4>, which further comprises an acid proliferating agent in addition to Component (A), Component (B) and Component (C).

<6> The chemical amplification type positive resist composition according to <5> wherein the content of the acid proliferating agent is 0.01 to 20% by weight, based on the total solid content in the resist composition.

<7> The chemical amplification type positive resist composition according to any one of <1> to <6>, which further comprises a nitrogen-containing basic organic compound in addition to Component (A), Component (B) and Component (C).

<8> The chemical amplification type positive resist composition according to <7> wherein the content of the nitrogen-containing basic organic compound is 0.01 to 10% by weight, based on the total solid content in the resist composition.

DETAILED DESCRIPTION OF THE PREFERRED EMBODIMENTS

In the resist composition of the present invention, one of the resin components is Component (A).

The examples of Component (A) can be those obtained by introducing protective group which can be dissociated by the action of an acid into resin having a phenol skeleton. Examples of the resin having a phenol skeleton include poly(p-hydroxystyrene).

Such groups having an ability to suppress dissolution into an alkali developer but unstable to an acid can be various known protective groups. Examples thereof include tert-butyl; groups in which quaternary carbon is bonded to oxygen atom such as tert-butoxycarbonyl, tert-butoxycarbonylmethyl, and the like; acetal type groups such as tetrahydro-2-pyranyl, tetrahydro-2-furyl, 1-ethoxyethyl, 1-(2-methylpropoxy)ethyl, 1-(2-methoxyethoxy)ethyl, 1-(2-acetoxyethoxy)ethyl, 1-[2-(1-adamantyloxy)ethoxy]ethyl, 1-[2-(1-adamantanecarbonyloxy)ethoxy]ethyl, and the like; residues of non-aromatic cyclic compounds such as 3-oxocyclohexyl, 4-methyltetrahydro-2-pyron-4-yl (derived from mevalonic lactone), and the like, and these groups will be substituted for hydrogen atom of phenolic hydroxyl group. These protective groups can be introduced into alkali-soluble resin having phenolic hydroxyl group by a known protective group introduction reaction. The above-mentioned resin can be obtained also by copolymerization using unsaturated compound having such group as one monomer.

In the resist composition of the present invention, other one of the resin components is Component (B).

Specifically, Component (B) is preferably resin obtained by protecting 10 to 60 mol % of hydroxyl group in poly(p-hydroxystyrene) with pivaloyl group.

Component (C), another component of the positive resist composition, is that which is decomposed to generate an acid by allowing radioactive ray such as light and electron beam to act on the acid generator itself or a resist composition containing the acid generator. The acid generated from the acid generator acts on the above-mentioned resin, to dissociate acid-labile group present in the resin. Such acid generators include, for example, onium salt compounds, s-triazine-based organic halogen compounds, sulfone compounds, sulfonate compounds and the like.

Specific examples of the acid generators include the following compounds.

Diphenyliodonium trifluoromethanesulfonate,
4-methoxyphenylphenyliodinium hexafluoroantimonate,
4-methoxyphenylphenyliodinium trifluoromethanesulfonate,
bis(4-tert-butylphenyl)iodonium tetrafluoroborate
bis(4-tert-butylphenyl)iodonium perfluorobutanesulfonate,
bis(4-tert-butylphenyl)iodonium hexafluorophosphate,
bis(4-tert-butylphenyl)iodonium hexafluoroantimonate
bis(4-tert-butylphenyl)iodonium trifluoromethanesulfonate,
bis(4-tert-butylphenyl)iodonium camphorsulfonate,
triphenylsulfonium hexafluorophosphate,
triphenylsulfonium hexafluoroantimonate,
triphenylsulfonium trifluoromethanesulfonate,
triphenylsulfonium perfluorobutanesulfonate,
triphenylsulfonium perfluorooctanesulfonate,
tri(4-methylphenyl)sulfonium trifluoromethanesulfonate,
tri(4-methylphenyl)sulfonium perfluorobutanesulfonate,
tri(4-methylphenyl)sulfonium perfluorooctanesulfonate,
4-methylphenyldiphenylsulfonium perfluorobutanesulfonate,
4-methoxyphenyldiphenylsulfonium hexafluoroantimonate,
4-methoxyphenyldiphenylsulfonium trifluoromethanesulfonate,
p-tolyldiphenylsulfonium trifluoromethanesulfonate,
p-tolyldiphenylsulfonium perfluorobutanesulfonate,
p-tolyldiphenylsulfonium perfluorooctanesulfonate,
2,4,6-trimethylphenyldiphenylsulfonium trifluoromethanesulfonate,
4-tert-butylphenyldiphenylsulfonium trifluoromethanesulfonate,
4-phenylthiophenyldiphenylsulfonium hexafluorophosphate,
4-phenylthiophenyldiphenylsulfonium hexafluoroantimonate,
1-(2-naphtholylmethyl)thiolanium hexafluoroantimonate,
1-(2-naphtholylmethyl)thiolanium trifluoromethanesulfonate,
4-hydroxy-1-naphthyldimethylsulfonium hexafluoroantimonate,
4-hydroxy-1-naphthyldimethylsulfonium trifluoromethanesulfonate,
cyclohexylmethyl(2-oxocyclohexyl)sulfonium trifluoromethanesulfonate,
cyclohexylmethyl(2-oxocyclohexyl)sulfonium perfluorobutanesulfonate,
cyclohexylmethyl(2-oxycyclohexyl)sulfonium perfluorootcanesulfonate,
2-methyl-4,6-bis(trichloromethyl)-1,3,5-triazine,
2,4,6-tris(trichloromethyl)-1,3,5-triazine
2-phenyl-4,6-bis(trichloromethyl)-1,3,5-triazine,
2-(4-chlorophenyl)-4,6-bis(trichloromethyl)-1,3,5-triazine,
2-(4-methoxyphenyl)-4,6-bis(trichloromethyl)-1,3,5-triazine,
2-(4-methoxy-1-naphthyl)-4,6-bis(trichloromethyl)-1,3,5-triazine,
2-(benzo[d][1,3]dioxolan-5-yl)-4,6-bis(trichloromeythyl)-1,3,5-triazine,
2-(4-methoxystyryl)-4,6-bis(trichloromethyl)-1,3,5-triazine,
2-(3,4,5-trimethoxystyryl)-4,6-bis(trichloromethyl)-1,3,5-triazine,
2-(3,4-dimethoxystyryl)-4,6-bis(trichloromethyl)-1,3,5-triazine,
2-(2,4-dimethoxystyryl)-4,6-bis(trichloromethyl)-1,3,5-triazine
2-(2-methoxystyryl)-4,6-bis(trichloromethyl)-1,3,5-triazine,
2-(4-butoxystyryl)-4,6-bis(trichloromethyl)-1,3,5-triazine,
2-(4-pentyloxystyryl)-4,6-bis(trichloromethyl)-1,3,5-triazine,
1-benzoyl-1-phenylmethyl p-toluenesulfonate (generally called "benzoin tosalate"),
2-benzoyl-2-hydroxy-2-phenylethyl p-toluenesulfonate (generally called α-methylolbenzoin tosylate),
1,2,3-benzen-tri-yl tris(methanesulfonate),
2,6-dinitrobenzyl p-toluenesulfonate,
2-nitrobenzyl p-toluenesulfonate,
4-nitrobenzyl p-toluenesulfonate,
diphenyl disulfone,
di-p-tolyl disulfone
bis(phenylsulfonyl)diazomethane,
bis(4-chlorophenylsulfonyl)diazomethane,
bis(p-tolylsulfonyl)diazomethane,
bis(4-tert-butylphenylsulfonyl)diazomethane,
bis(2,4-xylylsulfonyl)diazomethane,
bis(cyclohexylsulfonyl)diazomethane,
(benzoyl)(phenylsulfonyl)diazomethane,
N-(phenylsulfonyloxy)succinimide,
N-(trifluoromethylsulfonyloxy)succinimide,
N-(trifluoromethylsulfonyloxy)phthalimide,
N-(trifluoromethylsulfonyloxy)-5-norbornene-2,3-dicarboxyimide,
N-(trifluoromethylsulfonyloxy)naphthalimide,
N-(10-camphorsulfonyloxy)naphthalimide,
(5-propylsulfonyloxyimino-5H-thiophen-2-ylidene)-(2-methylphenlyl)acetonitrile,
(5-(4-methylphenyl)sulfonyloxyimino-5H-thiophen-2-ylidene)-(2-methylphenyl)acetonitrile,
(5-butylsulflonyloxyimino-5H-thiophen-2-ylidene)-(2-methylphenyl)acetonitrile,
(5-n-octylsulfonyloxyimino-5H-thiophen-2-ylidene)-(2-methylphenyl)acetonitrile,
(5-(2,4,6-trimethylphenyl)sulfonyloxyimino-5H-thiophen-2-ylidene)-(2-methylphenyl)acetonitrile,
(5-(2,4,6-triisopropylphenyl)sulfonyloxyimino-5H-thiophen-2-ylidene)-(2-methylphenyl)acetonitrile,
(5-(4-dodecylphenyl)sulfonyloxyimino-5H-thiophen-2-ylidene)-(2-methylphenyl)acetonitrile,
(5-(2-naphtyl)sulfonyloxyimino-5H-thiophen-2-ylidene)-(2-methylphenyl)acetonitrile,
(5-benzylsulfonyloxyimino-5H-thiophen-2-ylidene)-(2-methylphenyl)acetonitrile,
(oxydi-4,1-phenylene)bisdiphenylsulfonium bis(methanesulfonate),
(oxydi-4,1-phenylene)bisdiphenylsulfonium bis(benzenesulfonate),
(oxydi-4,1-phenylene)bisdiphenylsulfonium bis(p-toluenesulfonate), (oxydi-4,1-phenylene)bisdiphenylsulfonium bis (camphorsulfonate),
(oxydi-4,1-phenylene)bisdiphenylsulfonium bis (triisopropyobenzenesulfonate),
(oxydi-4,1-phenylene)bisdiphenylsulfonium bis (pentafluorobenzenesulfonate),
(oxydi-4,1-phenylene)bisdiphenylsulfonium bis (trifluoromethanesulfonate),
(oxydi-4,1-phenylene)bisdiphenylsulfonium bis (perfluorobutanesulfonate),
(oxydi-4,1-phenylene)bisdiphenylsulfonium bis (perfluorooctanesulfonate),
(oxydi-4,1-phenylene)bisdiphenylsulfonium bis{trifluoro-N-[(perfluoromethyl)sulfonyl]-1-methanesulfonamidate},
(oxydi-4,1-phenylene)bisdiphenylsulfonium bis{perfluoro-N-[(perfluoroethyl)sulfonyl]-1-ethanesulfonamidate},
(oxydi-4,1-phenylene)bisdiphenylsulfonium bis{perfluoro-N-[(perfluorobutyl)sulfonyl]-1-butanesulfonamidate},
(oxydi-4,1-phenylene)bisdiphenylsulfonium bis{trifluoro-N-[(perfluorobutyl)sulfonyl]-1-methanesulfonamidate},
(oxydi-4,1-phenylene)bisdiphenylsulfonium bis (tetrafluoroborate),
(oxydi-4,1-phenylene)bisdiphenylsulfonium bis (hexafluoroarsenate),
(oxydi-4,1-phenylene)bisdiphenylsulfonium bis (hexafluoroantimonate),
(oxydi-4,1-phenylene)bisdiphenylsulfonium bis (hexafluorophosphate),
(oxydi-4,1-phenylene)bisdi(4-tert-butylphenyl)sulfonium bis(trifluoromethanesulfonate),
(oxydi-4,1-phenylene)bisdi(4-tert-butylphenyl)sulfonium bis(perfluorobutanesulfonate),
(oxydi-4,1-phenylene)bisdi(p-tolyl)sulfonium bis (trifluoromethanesulfonate),
triphenylsulfonium (adamantan-1-ylmethyl) oxycarbonyldifluoromethanesulfonate, and the like.

As roughness of pattern profile is improved, the present positive resist composition preferably further comprise an acid proliferating agent in addition to Component (A), Component (B) and Component (C). Specific example of the acid proliferating agent include the following compound:

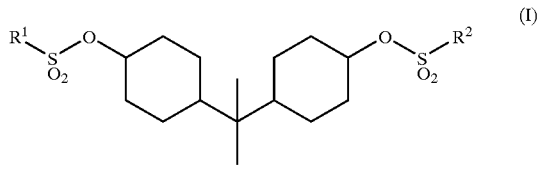

(I)

wherein R1 and R2 each independently represent alkyl having 1 to 15 carbon atoms; alkyl in which at least three hydrogen atoms is sustituted by fluorine atom and having 1 to 8 carbon atoms; or aryl having 6 to 10 carbon atoms.

In addition, performance deterioration due to the deactivation of an acid associated with leaving after exposure can be reduced by adding basic compounds, particularly nitrogen-containing basic organic compounds. Specific examples of such nitrogen-containing basic organic compounds include amines represented by the following formulae:

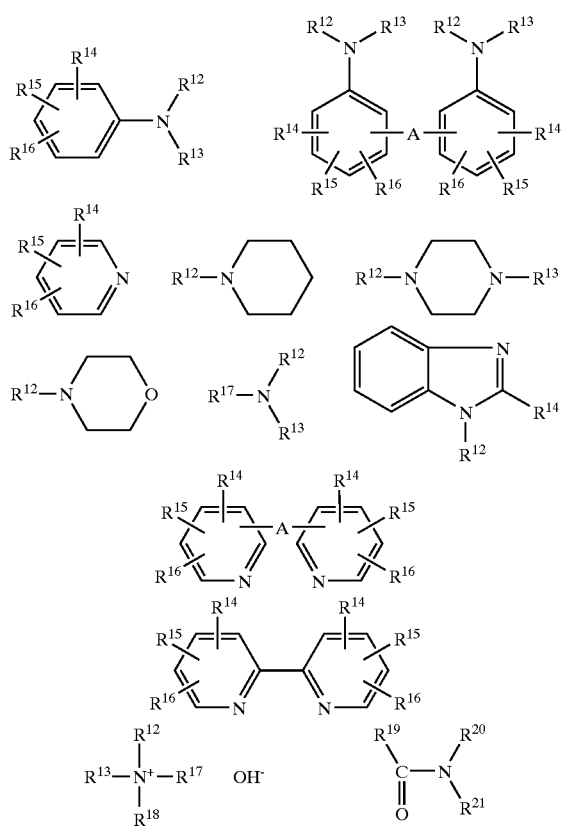

[3]

In the formulae, $R^{12}$, $R^{13}$ and $R^{14}$ each independently represent hydrogen, alkyl, cycloalkyl or aryl. The alkyl preferably has about 1 to 6 carbon atoms, the cycloalkyl preferably has about 5 to 10 carbon atoms, and the aryl preferably has about 6 to 10 carbon atoms. Furthermore, at least one hydrogen on the alkyl, cycloalkyl or aryl may each independently be substituted with hydroxyl group, amino group, or alkoxy group having 1 to 6 carbon atoms. At least one hydrogen on the amino group each independently may be substituted with alkyl group having 1 to 4 carbon atoms.

$R^{14}$, $R^{15}$ and $R^{16}$ each independently represent hydrogen, alkyl, cycloalkyl, aryl or alkoxy. The alkyl preferably has about 1 to 6 carbon atoms, the cycloalkyl preferably has about 5 to 10 carbon atoms, the aryl preferably has about 6 to 10 carbon atoms, and the alkoxy preferably has about 1 to 6 carbon atoms. Furthermore, at least one hydrogen on the alkyl, cycloalkyl, aryl or alkoxy each independently may be substituted with hydroxyl group, amino group, or alkoxy group having 1 to 6 carbon atoms. At least one hydrogen on the amino group may be substituted with alkyl group having 1 to 4 carbon atoms.

$R^{17}$ represents alkyl or cycloalkyl. The alkyl preferably has about 1 to 6 carbon atoms, and the cycloalkyl preferably has about 5 to 10 carbon atoms. Furthermore, at least one hydrogen on the alkyl or cycloalkyl may each independently be substituted with hydroxyl group, amino group, or alkoxy group having 1 to 6 carbon atoms. At least one hydrogen on the amino group may be substituted with alkyl group having 1 to 4 carbon atoms However, none of $R^{12}$, $R^{13}$, $R^{17}$ and $R^{18}$ in the compound represented by the above formula [3] is hydrogen.

A represents alkylene, carbonyl, imino, sulfide or disulfide. The alkylene preferably has about 2 to 6 carbon atoms.

Moreover, among $R^{12}$–$R^{18}$, in regard to those which can be straight-chained or branched, either of these may be permitted.

$R^{19}$, $R^{20}$ and $R^{21}$ each independently represent hydrogen, alkyl having 1 to 6 carbon atoms, aminoalkyl having 1 to 6 carbon atoms, hydroxyalkyl having 1 to 6 carbon atoms or substituted or unsubstituted aryl having 6 to 20 carbon atoms, or $R^{19}$ and $R^{20}$ bond to form alicyclic hydrocarbon ring together with adjacent carbon atom.

Examples of such compounds include hexylamine, heptylamine, octylamine, nonylamine, decylamine, aniline, 2-, 3- or 4-methylaniline, 4-nitroaniline, 1- or 2-naphtylamine, ethylenediamine, tetramethylenediamine, hexamethylenediamine, 4,4'-diamino-1,2-diphenylethane, 4,4'-diamino-3,3'-dimethyldiphenylmethane, 4,4'-diamino-3,3'-diethyidiphenylmethane, dibutylamine, dipentylamine, dihexylamine, diheptylamine, dioctylamine, dinonylamine, didecylamine, N-methylaniline, piperidine, diphenylamine, triethylamine, trimethylamine, tripropylamine, tributylamine, tripentylamine, trihexylamine, triheptylamine, trioctylamine, trinonylamine, tridecylamine, methyldibutylamine, methyldipentylamine, methyldihexylamine, methyldicyclohexylamine, methyldiheptylamine, methyldioctylamine, methyldinonylamine, methyldidecylamine, ethyldibutylamine, ethydipentylamine, ethyldihexylamine, ethydlheptylamine, ethyldioctylamine, ethyldinonylamine, ethyldidecylamine, dicyclohexylmethylamine, tris[2-(2-methoxyethoxy)ethyl]amine, triisopropanolamine, N,N-dimethylaniline, 2,6-isopropylaniline, imidazole, pyridine, 4-methylpyridine, 4-methyimidazole, bipyridine, 2,2'-dipyridylamine, di-2-pyridyl ketone, 1,2-di(2-pyridyl)ethane, 1,2-di(4-pyridyl)ethane, 1,3-di(4-pyridyl)propane, 1,2-bis(2-pyridyl)ethylene, 1,2-bis(4-pyridyl)ethylene, 1,2-bis(2-pyridyloxy)ethane, 4,4'-dipyridyl sulfide, 4,4'-dipyridyl disulfide, 1,2-bis(4-pyridyl)ethylene, 2,2'-dipicolylamine, 3,3'-dipicolylamine, tetramethylammonium hydroxide, tetrisopropylammonium hydroxide, tetrabutylammonium hydroxide, tetra-n-hexylammonium hydroxide, tetra-n-octylammonium hydroxide, phenyltrimethylammonium hydroxide, 3-trifluoromethylphenyltrimethylammonium hydroxide, (2-hydroxyethyl)trimethylammonium hydroxide (so-called "cholline"), N-methylpyrrolidone, dimethylimidazole, and the like.

Furthermore, hindered amine compounds having piperidine skeleton as disclosed in JP-A-H11-52575 can be used as quencher.

In the present positive resist composition, the content of Component (A), Component (B) and Component (C) is preferably 50 to 89.9% by weight, 10 to 50% by weight, and 0.1 to 20% by weight, respectively, based on the content, of total solid components in the present positive resist composition.

In resin components of the present positive resist composition, the ratio of P:Q is preferably 1:6 to 1:1, wherein P is total molar amount of the structural units having protective group which can be dissociated by the action of an acid into alkali-soluble resin and Q is the total molar amount of the structural units having phenolic hydroxyl group which itself make resin alkali-soluble.

When the acid proliferating agent is contained in the present positive resist composition, the content of the acid proliferating agent is usually 0.01 to 20% by weight also based on the content of total solid components in the present positive resist composition.

When the basic organic compound is used as a quencher in the present positive resist composition, it is preferred that the content of the basic organic compound in the composition is usually 0.01 to 10% by weight based on the content of total solid components in the present positive resist composition.

The present positive resist composition may also contain various additives such as sensitizers, dissolution inhibitors, resins other than the above resin, surfactants, stabilizers, and dyes as long as, the effect of the present invention is not obstructed.

The present resist composition generally becomes a liquid resist composition under the circumstances in which each of the above-described components is dissolved in a solvent. The liquid resist composition is applied on a substrate such as a silicon wafer according to a usual procedure such as spin coating.

Any solvent may be used as long as they dissolve each component, show suitable drying speed, and give a uniform and smooth film after evaporation of the solvent. Solvents generally used in this field can be used as the solvent.

Examples thereof include glycol ether esters such as ethylcellosolve acetate, methylcellosolve acetate, propylene glycol monomethyl ether acetate and the like; esters such as ethyl lactate, butyl acetate, amyl acetate, ethyl pyruvate and the like; ketones such as acetone, methyl isobutyl ketone, 2-heptanone, cylohexanone and the like; cyclic esters such as γ-butyrolactone and the like; alcohols such as 3-methoxybutanol and the like. These solvents can be used each alone or in combination of two or more.

The resist film applied on a substrate, and dried is subjected to an exposure treatment for patterning. Then, after a heat-treatment for promoting a deprotecting reaction (hereinafter referred to 'PEB'), development by an alkali developer is conducted. The alkali developer used herein can be various kinds of aqueous alkaline solutions used in this art. In general, aqueous solution of tetramethylammonium hydroxide or (2-hydroxyethyl)trimethylammonium hydroxide (generally referred to as colline) is often used.

Embodiments of the present invention were described above, however, the embodiments of the present invention disclosed above are only examples and the scope of the present invention is not limited to these embodiments. The scope of the present invention is defined by the claims, further, includes equivalent meanings to the claims and any variations in the claims.

The present invention will be further illustrated by examples. However, the present invention is not limited to them at all.

In the examples, % and parts showing content and use amount are by weight unless otherwise stated. Weight-average molecular weight (Mw) and degree of polydispersion (Mw/Mn) are values measured by gel permeation chromatography using polystyrene as a standard.

SYNTHESIS EXAMPLE 1

Synthesis of Partially Etherified Poly(p-hydroxystyrene) with 1-ethoxyethyl Group Into a 1 liter eggplant type flask was charged 40 g of poly(p-hydroxystyrene) [Weight-average molecular weight: 18000, degree of dispersion: 1.1] (333 mmol calculated using molecular weight of p-hydroxystyrene structural unit) and 47 mg (0.25 mmol) of p-toluenesulfonic acid monohydrate, and these were dissolved in 720 g of propylene glycol monomethyl ether acetate. This solution was subjected to pressure-reduced distillation under conditions of a temperature of 60° C. and a pressure of 10 Torr (1333 Pa) or less, to cause azeotropic dehydration. The weight of the solution after distillation was 337 g. This solution was transferred into a nitrogen-purged 500 ml four-necked flask, into this was dropped 12.0 g (166 mmol) of ethyl vinyl ether, then, these were reacted at 25° C. for 5 hours. To the reaction solution was added 62.3 g of propylene glycol monomethyl ether acetate and 320 g of methyl isobutyl ketone, further, 240 ml of ion-exchanged water was added and the mixture was stirred. Then, the mixture was allowed to stand still, to take out an organic layer portion. To the organic layer was added again 240 ml of ion exchanged water, the mixture was stirred for washing, then, allowed to stand still to cause liquid separation. Washing with ion exchanged water and liquid separation were conducted again, then, the organic layer was taken out and distilled under reduced pressure for removal of water and methyl isobutyl ketone by azeotropic distillation with propylene glycol monomethyl ether acetate, to give propylene glycol monomethyl ether acetate solution. The resulted solution of partially etherified poly(p-hydroxystyrene) with 1-ethoxyethyl group was obtained, and the polymer was analyzed by $^1$H-NMR. 36% of hydroxyl group in polyp-hydroxystyrene) was etherified with 1-ethoxyethyl group. This polymer is called resin A1.

SYNTHESIS EXAMPLE 2

Synthesis of Partially Etherified Poly(p-hydroxystyrene) with 1-ethoxyethyl Group Reaction, post treatment and analysis were conducted in the same manner as in Synthesis Example 1 except that the amount of ethyl vinyl ether was changed to 10 g (138 mmol) to obtain solution of partially etherified polyp-hydroxystyrene) with 1-ethoxyethyl group. 30% of hydroxyl group in poly(p-hydroxystyrene) was etherified 1-ethoxyethyl group. This polymer is called resin A2.

SYNTHESIS EXAMPLE 3

Synthesis of Partially Esterified Poly(p-hydroxystyrene) with 1-pivaloyl Group 650 g of poly(p-hydroxystyrene) ["VP-8000" manufactured by Nippon Soda K.K., weight-average molecular weight: 8000, degree of dispersion: 1.2] (5.41 mol calculated using molecular weight of p-hydroxystyrene structural unit) and 6.5 kg of acetone were charged and stirred for dissolution thereof, then, to this was added 246 g (2.43 mol) of triethylamine and the mixture was heated at 35° C. Into this resin solution was dropped 196 g of pivaloyl chloride (1.62 mol, 0.30 equivalent based on hydroxyl group of poly(p-hydroxystyrene)) over about 30 minutes. The mixture was stirred at 35° C. for 3 hours, then, 6.5 kg of methyl isobutyl ketone was added, and the mixture was washed with a 2% oxalic acid aqueous solution three times. The resulted organic layer was further washed with ion-exchanged water to cause liquid separation, and this operation was repeated five times. From this organic layer, the solvent was distilled off for concentration until the resin solution content became 2.0 kg. Then, 6.0 kg of propylene glycol monomethyl ether acetate was added, and the mixture was further concentrated to 2.5 kg to obtain solution of partially esterified poly(p-hydroxystyrene) with 1-pivaloyl group. The resulted polymer was analyzed by $^{13}$C-NMR. 29.1% of hydroxyl group in poly(p-hydroxystyrene) was esterified with pivaloyl group. The concentration of the resin solution was 30.0% which was measured by a dry weight reduction method. This resin is called resin A3.

SYNTHESIS EXAMPLE 4

Synthesis of Partially Esterified Poly(p-hydroxystyrene) with 1-pivaloyl Group 50 g of poly(p-hydroxystyrene) ["VP-8000" manufactured by Nippon Soda K.K., weight-average molecular weight: 8000, degree of dispersion: 1.2] (0.42 mol calculated using molecular weight of p-hydroxystyrene structural unit) and 500 g of acetone were charged and stirred for dissolution thereof, then, to this was added 12.6 g (0.12 mol) of triethylamine and the mixture was heated at 35° C. Into this resin solution was dropped 10 g of pivaloyl chloride (0.08 mol, 0.20 equivalent based on hydroxyl group of poly(p-hydroxystyrene)) over about 10 minutes. The mixture was stirred at 35° C. for 3 hours, then, 500 g of methyl isobutyl ketone was added, and the mixture was washed with a 2% oxalic acid aqueous solution three times. The resulted organic layer was further washed with ion-exchanged water to cause liquid separation, and this operation was repeated five times. From this organic layer, the solvent was distilled off for concentration until the resin solution content became 150 g. Then, 450 g of propylene glycol monomethyl ether acetate was added, and the mixture was further concentrated to 175 g to obtain solution of partially esterified poly(p-hydroxystyrene) with 1-pivaloyl group. The resulted polymer was analyzed by $^{13}$C-NMR. 20.6% of hydroxyl group in poly(p-hydroxystyrene) was esterified with pivaloyl group. The concentration of the resin solution was 29.9% which was measured by a dry weight reduction method. This resin is called resin A4.

SYNTHESIS EXAMPLE 5

Synthesis of Partially Esterified Poly(p-hydroxystyrene) with 1-pivaloyl Group 20 parts of poly(p-hydroxystyrene) [weight-average molecular weight: 15000, degree of dispersion: 1.2] (0.17 mol calculated using molecular weight of p-hydroxystyrene structural unit) and 148 parts of acetone were charged and stirred for dissolution thereof, then, to this was added 6.3 parts (0.06 mol) of triethylamine and the mixture was heated at 35° C. Into this resin solution was dropped 5.0 parts of pivaloyl chloride (0.04 mol, 0.25 equivalent based on hydroxyl group of poly(p-hydroxystyrene)) over about 10 minutes. The mixture was stirred at 35° C. for 1.5 hours, then, 200 parts of methyl isobutyl ketone was added, and the mixture was washed with a 0.5% oxalic acid aqueous solution three times. The resulted organic layer was further washed with ion-exchanged water to cause liquid separation, and this operation was repeated five times. From this organic layer, the solvent was distilled off for concentration until the resin solution content became 70 parts. Then, 200 parts of propylene glycol monomethyl ether acetate was added, and the mixture was further concentrated to 73 parts to obtain solution of partially esterified poly(p-hydroxystyrene) with 1-pivaloyl group. The concentration of the resin solution was 29.5% which was measured by a heat weight reduction method. The resulted polymer was analyzed by $^1$H-NMR. 23.8% of hydroxyl group in poly(p-hydroxystyrene) was esterified with pivaloyl group. This resin is called resin A5.

SYNTHESIS EXAMPLE 6

Synthesis of Partially Etherified Poly(p-hydroxystyrene) with Ethyl Group 30.0 parts of poly(p-hydroxystyrene) [weight-average molecular weight: 15000, degree of dispersion: 1.2] (0.25 mol calculated using molecular weight of p-hydroxystyrene structural unit) and 120 parts of acetone were charged and stirred for dissolution thereof, then, to this was added 23.2 parts (0.17 mol) of potassium carbonate and 16.4 parts of potassium iodide, and the temperature thereof was increased until reflux condition. The reflux condition was subsequently maintained for 12 hours. After cooling, methyl isobutyl ketone was added to this and organic layer was washed with 2.0% oxalic acid aqueous solution four times, then, washed with ion-exchanged water five times. The organic layer after washing was concentrated to 67 parts, and 200 parts of propylene glycol monomethyl ether acetate was added, and the mixture was further concentrated to 110 parts to obtain solution of partially etherified poly(p-hydroxystyrene) with ethyl group.

The concentration of the resin solution was 29.6% which was measured by a heat weight reduction method. The resulted polymer was analyzed by $^1$H-NMR. 41.5% of hydroxyl group in poly(p-hydroxystyrene) was etherified with ethyl group. This resin is called resin A6.

EXAMPLES 1 To 2 AND COMPARATIVE EXAMPLE 1

Acid Generator B1: bis(cycohexylsulfonyl)diazomethane ["DAM-301" manufactured by Midori Kagaku K.K.]

Acid Generator B2: triphenylsulfonium 2,4,6-triisopropylbenzenesulfonate

Quencher C1: dicyclohexylmethylamine

Quencher C2: tris[2-(2-methoxyethoxy)ethyl]amine

Acid Proliferating Agent D1:
2,2'-bis(4-hydroxycyclohexyl)propane=bis(4-methylbenzenesulfonate)

Resins (13.5 parts in total, calculated as solid content) were mixed at a ratio (calculated as solid content) shown in Table 1, and 0.4 part of the Acid Generator B1, 0.15 part of the Acid Generator B2, 0.03 part of the Quencher C1, 0.03 part of the Quencher C2 and 0.05 part of the Acid Proliferating Agent D1 were dissolved each using propylene glycol monomethyl ether acetate as dilution solvent, further, the mixtures was filtrated through fluorine resin filter having pore diameter of 0.2 µm, to prepare resist solution.

On a silicon wafer, the above-mentioned resist solution was applied using a rotation applicator so that the membrane thickness after drying was 1.05 µm. Prebake after application of the resist solution was conducted at 100° C. for 60 seconds on a hot plate. The wafer carrying thus formed resist membrane was exposed to line and space pattern using a KrF excimer laser exposure ["NSR 2205 EX12B" manufactured by Nikon Corp., NA=0.5, σ=0.8]. Then, post exposure bake was conducted at 110° C. for 60 seconds on a hot plate, further, paddle development was conducted with a 2.38% tetramethylammonium hydroxide aqueous solution for 60 seconds. The pattern after the development was observed by a scanning type electron microscope, and effective sensitivity, resolution and profile were checked according to the following methods, and the results are shown in Table 2.

Effective sensitivity: It is represented by exposure amount when line and space pattern of 0.25 µm is 1:1.

Dense resolution: It is represented by the minimum size of separated 1:1 line and space pattern without causing membrane sliding by exposure amount at effective sensitivity when using masks having line and space line width ratio of 1:1.

Isolated resolution: It is represented by the minimum size forming patterns without causing membrane sliding by exposure amount at effective sensitivity when using a mask having only line patterns.

Membrane remaining ratio: It represents a ratio of the membrane thickness after development to the membrane thickness after prebake treatment.

TABLE 1

| Example No. | Resin | | | |
|---|---|---|---|---|
| Example 1 | A1/53% | A2/22% | A3/12% | A4/13% |
| Example 2 | A1/53% | A2/22% | A5/25% | |
| Comparative example 1 | A1/53% | A2/22% | A6/25% | |

TABLE 2

| Example No. | Effective sensitivity [mJ/cm$^2$] | Dense resolution [µm] | Isolated resolution [µm] | Membrane remaining ratio [%] |
|---|---|---|---|---|
| Example 1 | 42 | 0.18 | 0.20 | 98 |
| Example 2 | 41 | 0.20 | 0.17 | 98 |
| Comparative example 1 | 50 | 0.21 | 0.23 | 98 |

The chemical amplification type positive resist composition of the present invention can maintain excellent abilities together with sensitivity, close resolution and isolated resolution, without significantly decreasing basic abilities such as membrane remaining ratio and the like,

What is claimed is:

1. A chemical amplification type positive resist composition comprising
   (A) resin having a phenol skeleton wherein the phenol skeleton has protective group which can be dissociated by the action of an acid, the phenol skeleton itself is insoluble or poorly soluble in an alkali aqueous solution and the phenol skeleton becomes soluble in an alkali aqueous solution after dissociation of the protective group (hereinafter referred to "Component (A)"),
   (B) resin obtained by protecting a part of hydroxyl group in poly(p-hydroxystyrene) with pivaloyl group (hereinafter referred to "Component (B)") and
   (C) an acid generator (hereinafter referred to "Component (C)").

2. The chemical amplification type positive resist composition according to claim 1, wherein the content of Component (A), Component (B) and Component (C) is 50 to 89.9%, 10 to 50% and 0.1 to 20% by weight respectively, based on the total solid content in the resist composition.

3. The chemical amplification type positive resist composition according to claim 1, wherein the protective group in Component (A) is acetal group.

4. The chemical amplification type positive resist composition according to claim 1, wherein the protective group in Component (A) is 1-ethoxyethyl group.

5. The chemical amplification type positive resist composition according to claims 1, which further comprises an acid proliferating agent in addition to Component (A), Component (B) and Component (C).

6. The chemical amplification type positive resist composition according to claim 5 wherein the content of the acid proliferating agent is 0.01 to 20% by weight, based on the total solid content in the resist composition.

7. The chemical amplification type positive resist composition according to claims 1, which further comprises a nitrogen-containing basic organic compound in addition to Component (A), Component (B) and Component (C).

8. The chemical amplification type positive resist composition according to claim 7 wherein the content of the nitrogen-containing basic organic compound is 0.01 to 10% by weight, based on the total solid content in the resist composition.

* * * * *